US006072219A

United States Patent [19]

Ker et al.

[11] Patent Number: 6,072,219

[45] Date of Patent: Jun. 6, 2000

[54] SUBSTRATE-TRIGGERING ELECTROSTATIC DISCHARGE PROTECTION CIRCUIT FOR DEEP-SUBMICRON INTEGRATED CIRCUITS

[75] Inventors: Ming-Dou Ker, Hsinchu; Tung-Yang Chen, Tainan; Chung-Yu Wu, Hsinchu, all of Taiwan

[73] Assignee: United Microelectronics Corp., Hsin-chu, Taiwan

[21] Appl. No.: 09/034,529

[22] Filed: Mar. 3, 1998

[30] Foreign Application Priority Data

Jan. 15, 1998 [TW] Taiwan ................................ 87100473

[51] Int. Cl.[7] ............................ H01L 23/62; H01L 27/01

[52] U.S. Cl. ........................................... 257/355; 257/354

[58] Field of Search ..................................... 257/354, 355

[56] References Cited

U.S. PATENT DOCUMENTS 4,829,350 5/1989 Miller .

5,543,650 8/1996 Au et al. .

5,615,073 3/1997 Fried et al. .

5,811,856 9/1998 Lee .

FOREIGN PATENT DOCUMENTS 0 549 320 6/1993 European Pat. Off. .

*Primary Examiner*—Stephen D. Meier

*Attorney, Agent, or Firm*—Merchant & Gould P.C.

[57] ABSTRACT

A substrate-triggering ESD protection circuit is provided for use on a deep-submicron integrated circuit for ESD protection of the integrated circuit. The ESD protection circuit is incorporated between an input end and the internal circuit of the integrated circuit formed on a substrate. The ESD protection circuit utilizes a featured substrate-triggering operation to trigger the ESD-protection transistors formed in N-wells of the substrate into conducting state so as to bypass the ESD current to the ground. The ESD protection circuit allows a simplified semiconductor structure to fabricate, while nonetheless providing an increased level of ESD protection capability for the deep-submicron integrated circuit.

15 Claims, 7 Drawing Sheets

SUBSTRATE-TRIGGERING ELECTROSTATIC DISCHARGE PROTECTION CIRCUIT FOR DEEP-SUBMICRON INTEGRATED CIRCUITS

CROSS-REFERENCE TO RELATED APPLICATION

This application claims the priority benefit of Taiwan application serial no. 87100473, filed Jan. 15, 1998, the full disclosure of which is incorporated herein by reference.

BACKGROUND OF THE INVENTION

1. Field of the Invention

This invention relates to semiconductor technologies, and more particularly, to an substrate-triggering electrostatic discharge (ESD) protection circuit for use on a deep-submicron integrated circuit for ESD protection of the internal circuit thereof against ESD stress.

2. Description of Related Art

In the fabrication of integrated circuits, electrostatic discharge (ESD) is a major problem that can cause damage to the internal circuit of the integrated circuits. One solution to this problem is to incorporate an ESD protection circuit through an on-chip method on the input/output (I/O) pads of CMOS (complementary metal-oxide semiconductor) devices. However, as the semiconductor fabrication technologies have advanced to the deep-submicron level of integration, the conventional ESD protection circuit is no longer suitable for use to provide adequate ESD robustness. This problem will be illustratively depicted in the following with reference to FIGS. 1–3.

FIG. 1 is a schematic circuit diagram of a conventional ESD protection circuit connected to the input stage 10 of the internal circuit of an integrated circuit. As shown, an ESD protection circuit, which includes a field oxide device (FOD) F1, a resistor R1, and a gate-grounded NMOS transistor N1, is incorporated between an input pad IP and the input stage 10 (which is a CMOS device including a pair of serially connected PMOS transistor and NMOS transistor). The FOD F1 has a drain connected to the input pad IP and a source connected to the ground $V_{SS}$. The resistor R1 is connected between the input pad IP and the input stage 10. The NMOS transistor N1 has a drain connected to the node between the resistor R1 and the input stage 10, a source connected to the ground $V_{SS}$, and a gate tied to the source to be connected together to the ground $V_{SS}$. When an over-stress voltage due to ESD is applied to the input pad IP, it will pass through the resistor R1 to the gate oxide of the paired PMOS transistor and NMOS transistor in the input stage 10. In order to suppress the over-stress voltage across the gate oxide, the gate-grounded NMOS transistor N1 is specifically designed to operate in its breakdown mode so that the ESD current can be bypassed to the ground $V_{SS}$. However, when the integrated circuit is fabricated by deep-submicron technologies, the gate oxide will be formed with a very thin thickness for high-speed and low-voltage operation. This thin thickness will cause the breakdown voltage of the gate oxide in the input stage 10 to be significantly lowered. In this case, in order to allow the ESD protection circuit to be nonetheless effective, it is required that the breakdown voltage of the gate-grounded NMOS transistor N1 should be lower than the breakdown voltage of the gate oxide in the input stage 10. To achieve this, however, the channel length of the gate-grounded NMOS transistor N1 should be made as short as possible so as to provide the desired low breakdown voltage. However, a short channel length will then undesirably make the gate-grounded NMOS transistor N1 less withstandable to a high ESD stress. The provision of the resistor R1 is a solution to this problem, in that it can reduce the ESD current flowing through the gate-grounded NMOS transistor N1. The greater the resistance of the resistor R1, the better can the resistor R1 suppress the ESD current flowing through the gate-grounded NMOS transistor N1. However, a large resistance for the resistor R1 will then undesirably cause a considerable time delay to the signal being transferred from the input pad IP to the input stage 10 of the associated integrated circuit, causing a degrade in the performance of this integrated circuit. From the foregoing description, it can be learned that the use of the ESD protection circuit of FIG. 1 in an IC will encounter a number of tradeoff problems in the design of this ESD protection circuit.

In the circuit of FIG. 1, the FOD F1 is used to pick the ESD current in the input pad IP. This FOD F1 is formed without an LDD (lightly-doped drain) structure, so that it has a higher strength to withstand ESD current than the gate-grounded NMOS transistor N1. In practice, if the FOD F1 is fabricated by the 0.5 $\mu$m CMOS technology, it would be twice greater in ESD robustness than the gate-grounded NMOS transistor N1 that has the same layout area. If the FOD F1 is formed with a long channel length, it can have a higher breakdown voltage than the gate-grounded NMOS transistor N1. The breakdown voltage of the FOD F1 can therefore be closely equal to or greater than the breakdown voltage of the gate oxide in the input stage 10. Therefore, the combination of the FOD F1 with the gate-grounded NMOS transistor N1 can provide an ESD protection capability for the input state 10 of the integrated circuit.

From recent researches, it has been found that the bias voltage applied to the substrate of the integrated circuit can be used to raise the ESD robustness. FIG. 2 is a graph showing the various $I_{DS}$ (drain-to-source current) versus $V_{DS}$ (drain-to-source voltage) characteristics of the FOD F1 and gate-grounded NMOS transistor N1 in the circuit of FIG. 1 when operated in breakdown mode for various substrate bias voltages. As shown, the plot indicated by the reference numeral 20 is the $I_{DS}$-$V_{DS}$ characteristic of the gate-grounded NMOS transistor N1 when its substrate is biased at 0 V (volt), which has a second breakdown point as indicated by the reference numeral 21; the plot indicated by the reference numeral 22 is the $I_{DS}$-$V_{DS}$ characteristic of the FOD F1 when its substrate is biased at 0 V (volt), which has a second breakdown point as indicated by the reference numeral 23; and the plot indicated by the reference numeral 24 is the $I_{DS}$-$V_{DS}$ characteristic of the FOD F1 when its substrate is applied with a bias voltage of 0.8 V (volt), which has a second breakdown point as indicated by the reference numeral 25. It can be clearly learned from the characteristic plots of FIG. 2 that the position of the second breakdown points of the FOD F1 and gate-grounded NMOS transistor N1 can be affected by the applied substrate bias.

The ESD robustness of the FOD can be appraised by obtaining the relationship between the second-breakdown current $I_{t2}$ and the substrate bias voltage $V_{SB}$. FIG. 3 is a graph in which the solid circular dots represent the $I_{t2}$-$V_{SB}$ characteristic of the FOD F1 in FIG. 1 when it is fabricated by a 0.5 $\mu$m CMOS technology, and the hollowed square box represents the $I_{t2}$-$V_{SB}$ characteristic of the gate-grounded NMOS transistor N1 in FIG. 1. The magnitude of $I_{t2}$ in each unit width of the channel in the FOD F1 can be raised through an adjustment in the forward bias voltage to the substrate. From FIGS. 2 and 3, it can be learned that the magnitude of $I_{t2}$ in the NMOS transistor N1 with a 0-V substrate bias is about 4.8 mA/μm. For the FOD F1, when a 0 V bias voltage is applied to the substrate thereof, the magnitude of $I_{t2}$ therein is about 9.0 mA/μm; and when a 0.8-V bias voltage is applied, the magnitude of $I_{t2}$ therein will be raised to about 18.2 mA/μm, which is four times larger than that of the gate-grounded NMOS transistor N1 with a 0-V substrate bias, and two times larger than that of the FOD when applied with a 0.8-V substrate bias.

Fundamentally, the ESD robustness of an ESD protection circuit is substantially proportional to the magnitude of the second-breakdown current $I_{t2}$. Roughly speaking, the ESD robustness of the ESD protection circuit in human body mode (HBM) is about equal to the multiplication of the magnitude of the second-breakdown current with the value of the standard discharge resistance in HBM, i.e., 1,500 Ω. Therefore, if the substrate of the FOD is applied with a suitable bias voltage, it can provide a relatively large ESD robustness with just a small layout area on the integrated circuit,

SUMMARY OF THE INVENTION

It is therefore an objective of the present invention to provide a substrate-triggering ESD protection circuit, which is particularly designed for use on a deep-submicron integrated circuit to provide a high ESD protection capability.

It is another an objective of the present invention to provide a substrate-triggering ESD protection circuit, which can be used in an integrated circuit fabricated by the CMOS technology without requiring the use of additional processes to provide the desired ESD protection capability.

In accordance with the foregoing and other objectives of the present invention, a substrate-triggering ESD protection circuit for use on deep-submicron integrated circuits is provided.

In one aspect of the invention, the ESD protection circuit includes the following constituent elements:

(a) an input stage connected between the input pad and the internal circuit of the integrated circuit;

(b) an NMOS transistor having a drain connected to the input pad, a gate connected to the ground, and a source connected to a common node;

(c) a resistor connected between the common node and the ground; and (d) an FOD (field oxide device) having a parasitic LBJT (lateral bipolar junction transistor) formed therein, and said FOD having a drain connected to the input pad and a source connected to the ground.

In the foregoing ESD protection circuit, the substrate of said FOD and the source and substrate of said NMOS transistor are connected together to the common node; and the parasitic LBJT has a collector formed from the drain of said FOD and an emitter formed from the source of said FOD, and a base formed from the substrate of said FOD.

In another aspect of the invention, the ESD protection circuit includes the following constituent elements:

(a) an input stage connected between the input pad and the internal circuit of the integrated circuit;

(b) a first NMOS transistor having a drain connected to the input pad, a gate connected to the ground, and a source connected to a common node, and the substrate of said first NMOS transistor being connected to the common node;

(c) a resistor connected between the common node and the ground; and (d) a second NMOS transistor having a parasitic LBJT formed therein, and said second NMOS transistor having a drain connected to the input pad, a source connected to the ground, and a gate connected to the ground.

In the foregoing ESD protection circuit, the substrate of said second NMOS transistor and the source and substrate of said first NMOS transistor are connected together to the common node; and the parasitic LBJT has a collector formed from the drain of said second NMOS transistor and an emitter formed from the source of said second NMOS transistor, and a base formed from the substrate of said second NMOS transistor.

In still another aspect of the invention, the ESD protection circuit includes the following constituent elements:

(a) an input stage connected between the input pad and the internal circuit of the integrated circuit;

(b) a first NMOS transistor having a channel of a first semiconductor type, said first NMOS transistor further having a drain connected to the input pad, a gate connected to a bias point, and a source connected to a common node, and the substrate of said first NMOS transistor being connected to the common node;

(c) a resistor connected between the common node and the bias point; and (d) a second NMOS transistor having a channel of the first semiconductor type, said second NMOS transistor further having a parasitic LBJT formed therein, and said second NMOS transistor having a drain connected to the input pad, a source connected to the bias point, and a gate connected to the bias point.

In the foregoing ESD protection circuit, the substrate of said second NMOS transistor and the source and substrate of said first NMOS transistor are connected together to the common node; and the parasitic LBJT has a collector formed from the drain of said second NMOS transistor and an emitter formed from the source of said second NMOS transistor, and a base formed from the substrate of said second NMOS transistor.

The invention provides an ESD protection circuit which is characterized in that in the design of a substrate-triggering method to trigger a parasitic LBJT in the ESD protection circuit to thereby increase the second-breakdown current for enhanced ESD protection. Further, the ESD protection circuit of the invention is characterized in that it can use a low triggering voltage for ESD protection while nonetheless providing an enhanced ESD protection for the deep-submicron integrated circuit. Moreover, the ESD protection circuit of the invention is characterized in the provision of an N-well structure in the substrate, on which the ESD protection circuit and the associated deep-submicron integrated circuit are formed to enhance ESD protection.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

Figure 4:
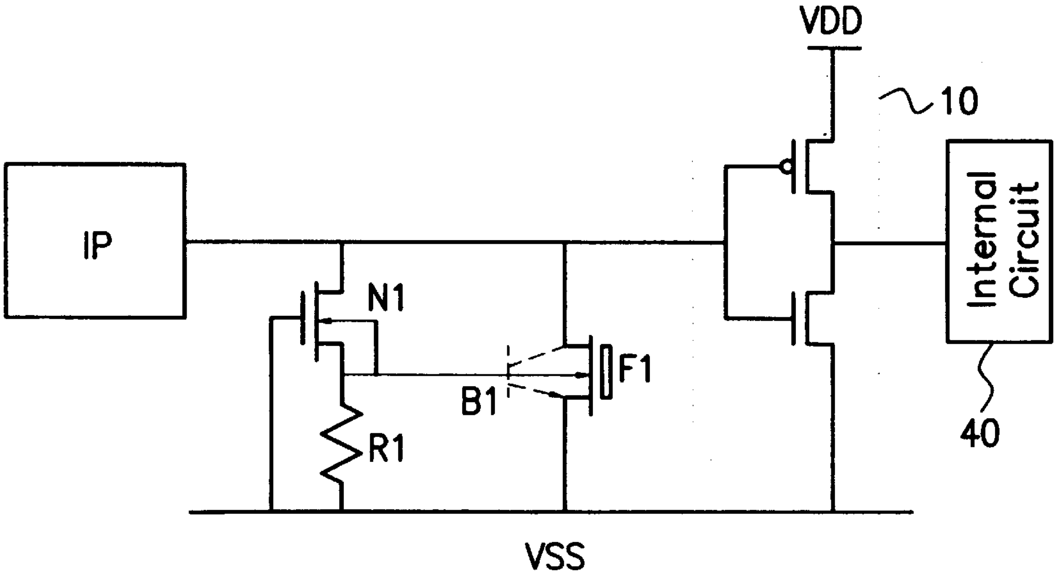
FIG. 4 is a schematic circuit diagram of a first preferred embodiment of the ESD protection circuit according to the invention.

FIG. 4 is a schematic circuit diagram of a first preferred embodiment of the ESD protection circuit according to the invention which is characterized in the use of a substrate-triggering feature to provide ESD protection for the internal circuit 40 of a deep-submicron integrated circuit. As shown, the ESD protection circuit of the invention is incorporated between an input pad IP and the input stage 10 of the internal circuit 40 of the integrated circuit. This ESD protection circuit includes a short-channel gate-grounded NMOS transistor N1, a resistor R1, and a field oxide device (FOD) F1. The NMOS transistor N1 has a drain connected to the input pad IP, a gate connected to the ground, and a source connected to one end of the resistor R1 which has the other end connected to the ground $V_{SS}$. The FOD F1 has a drain connected to the input pad IP and a source connected to the ground $V_{SS}$. The input stage 10 is a CMOS circuit consisting of a PMOS transistor and an NMOS transistor, which is connected between a system voltage $V_{DD}$ and the ground $V_{SS}$. The FOD F1 has a parasitic lateral bipolar junction transistor (LBJT) B1 formed therein, which is drawn in dotted lines beside the FOD F1 in FIG. 4. Both the source and the substrate of the NMOS transistor N1 are connected to the substrate of the FOD F1. The parasitic LBJT B1 has a collector formed from the drain of the FOD F1, an emitter formed from the source of the FOD F1, and a base formed from the substrate of the FOD F1. Further, the base of the parasitic LBJT B1 is connected to the node between the resistor R1 and the source of the NMOS transistor N1.

Figure 1:
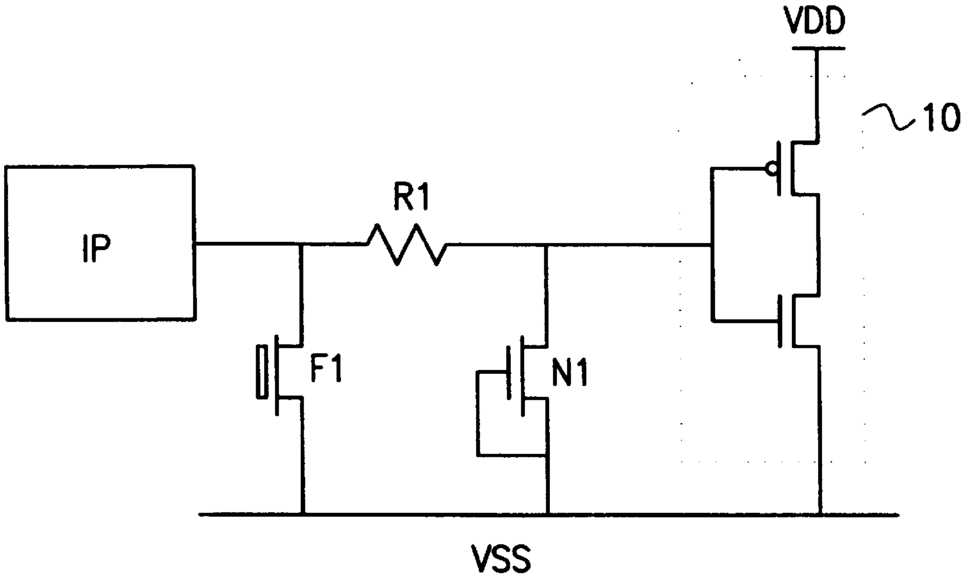
FIG. 1 is a schematic circuit diagram of a conventional ESD protection circuit.
Figure 2:
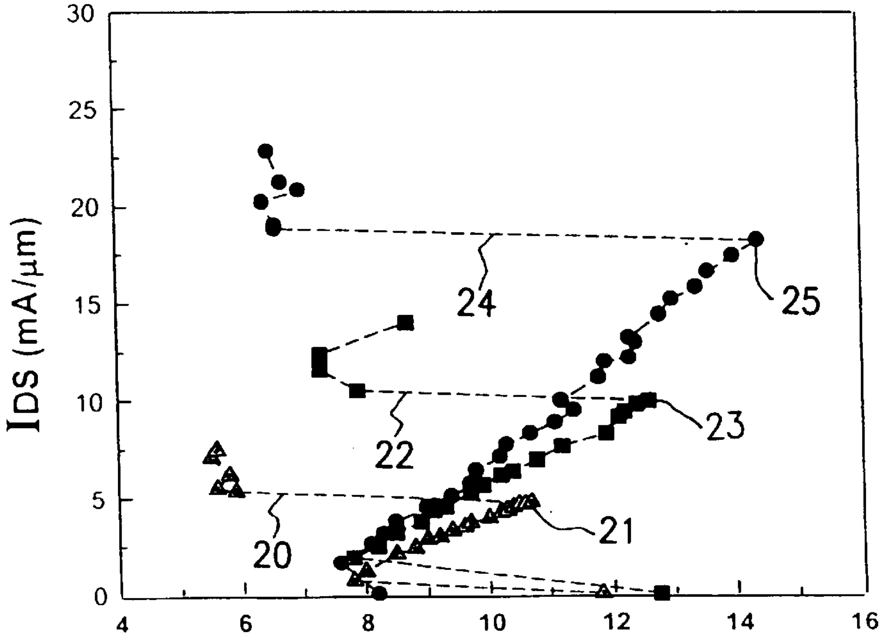
FIG. 2 is a graph, showing the various $I_{DS}$ (drain-to-source current) versus $V_{DS}$ (drain-to-source voltage) characteristics of an FOD and an NMOS transistor used in the conventional ESD protection circuit of FIG. 1.
Figure 3:
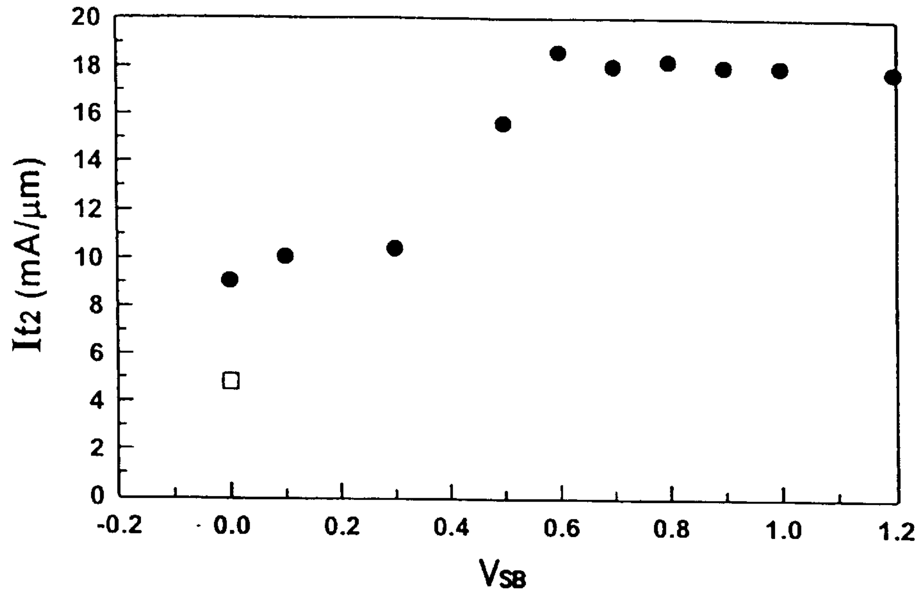
FIG. 3 is a graph, showing the $I_{t2}$ versus $V_{SB}$ characteristics of an FOD fabricated by a 0.5 μm CMOS technology.

In the prior art of FIG. 1, the FOD F1 will be triggered on (switched to conducting state) by causing a drain snapback breakdown therein. In the invention of FIG. 4, the FOD F1 will be triggered on by first setting a suitable forward bias voltage on the base-emitter junction of the parasitic LBJT B1 in the FOD F1 and then using the substrate bias voltage to trigger on the parasitic LBJT B1. When the FOD F1 is applied with a positive substrate bias voltage, the threshold voltage to trigger on the FOD F1 will be lower than the drain breakdown voltage of the FOD F1. Therefore, in the event of an ESD stress, the combination of the NMOS transistor N1 and the resistor R1 can provide a substrate-triggering current to trigger on the parasitic LBJT B1 to provide the desired ESD protection for the input stage 10 and the internal circuit 40 of the deep-submicron integrated circuit.

When the package pins of the deep-submicron integrated circuit receive an ESD stress, it will proceed to the input pad IP and then to the NMOS transistor N1, thus causing a snapback breakdown in the NMOS transistor N1 that will then cause the generation of a current in the substrate (referred to as substrate-triggering current) that will flow to the base of the parasitic LBJT B1 in the FOD F1. When the breakdown current is flowing through the resistor R1 to the ground $V_{SS}$, the potential at the substrate will be thereby raised, causing the parasitic LBJT B1 in the FOD F1 to be very quickly triggered on by the substrate-triggering current. In this manner, the FOD F1 can be switched quickly into conducting state by a relative low voltage to suppress the ESD voltage across the gate oxide in the input stage 10, thus protecting the gate oxide in the input stage 10 from being damaged by the ESD voltage. It is apparent from the foregoing description that the fundamental operation of the foregoing ESD protection circuit of the invention is essentially different from the prior art of FIG. 1.

Figure 5:
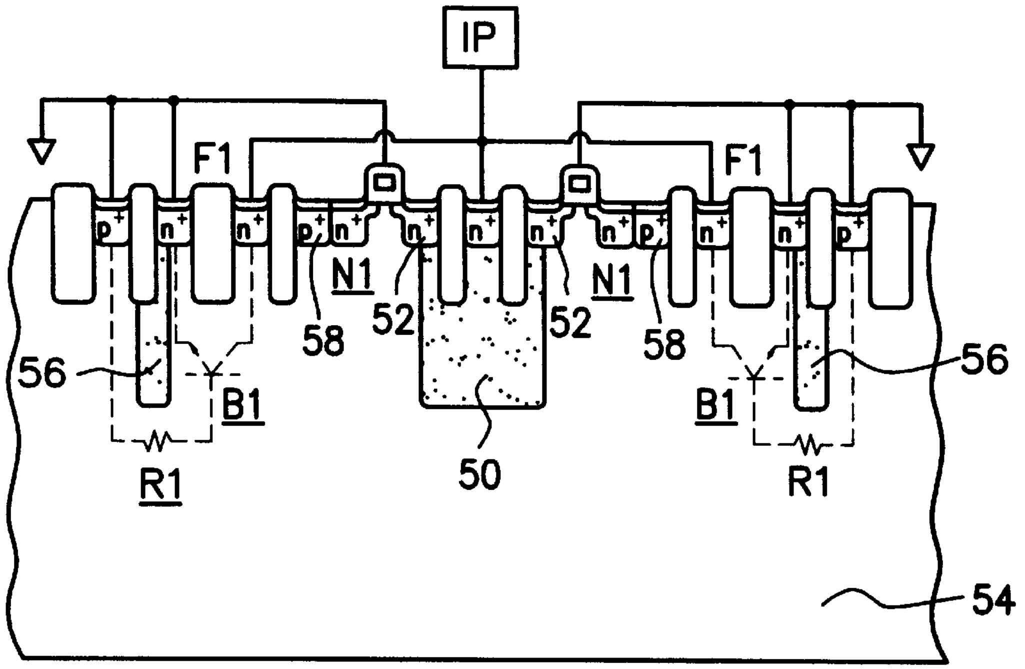
FIG. 5 is a schematic cross-sectional view of a first realization of the ESD protection circuit of FIG. 4 in the substrate of a deep-submicron integrated circuit.

FIG. 5 is a schematic cross-sectional view showing a first realization of the ESD protection circuit of FIG. 4 in the substrate of a deep-submicron integrated circuit which is fabricated by using the 0.25 $\mu$m trench-isolation CMOS technology. The symmetric semiconductor structure of FIG. 5 allows a balanced current that can help increase the reliability of the ESD protection circuit. As shown, the NMOS transistor N1, the resistor R1, and the FOD F1 are formed on a substrate, such as a P-type substrate 54, which is formed with a first N-well 50 and a second N-well 56.

As shown in FIG. 5, the first N-well 50 is electrically connected to the input pad IP and also to the drain 52 of the NMOS transistor N1 for the purpose of protecting the drain junction of the NMOS transistor N1 from being burned out. Since by the deep-submicron MOS technology, the NMOS transistor N1 will be formed with a short channel, an LDD, and a silicide-based diffusion area, which would considerably weaken its ESD protection capability. The first N-well 50 can allow the NMOS transistor N1 to provide an ESD current suppressing effect that can protect the NMOS transistor N1 against ESD stress before the FOD F1 is being triggered on. The NMOS transistor N1 can trigger on the FOD F1 through the P-type substrate 54, but it is not the primary element to bypass the ESD current. Therefore, the provision of the first N-well 50 would not affect the NMOS transistor N1 in its triggering capability.

The resistor R1 is realized by using the parasitic substrate resistance. The second N-well 56 is formed in the source of the FOD F1, which can collect the triggering current from the highly-doped P-type diffusion area 58 to thereby apply a forward bias voltage to the base-emitter junction of the parasitic LBJT B1 in the FOD F1 for the purpose of triggering the parasitic LBJT B1 in the FOD F1 into conducting state. The second N-well 56 also can help to increase the resistance of the resistor R1. Therefore, when the NMOS transistor N1 is at the breakdown point due to an ESD stress being applied to the input pad IP, the breakdown current from the NMOS transistor N1 will flow through the highly-doped P-type diffusion area 58 to the P-type substrate 54. The substrate-triggering current will then be collected by the second N-well 56 in the FOD F1 to be thereby used to bias the base-emitter junction of the parasitic LBJT B1 in the FOD F1. This can cause the FOD F1 to be quickly triggered into conducting state, thus bypassing the ESD current from the input pad IP to prevent the ESD current from flowing to the input stage 10. The ESD protection circuit of the invention is thus considerably enhanced in its ESD protection capability through the foregoing substrate-triggering feature.

Figure 6:
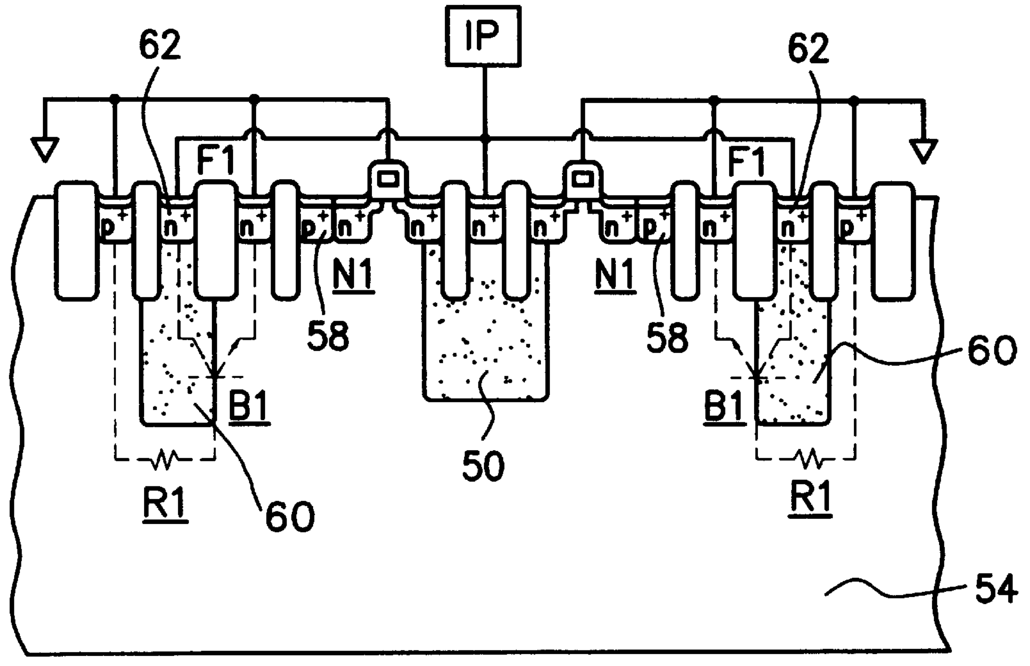
FIG. 6 is a schematic cross-sectional view of a second realization of the ESD protection circuit of FIG. 4 in the substrate of a deep-submicron integrated circuit.

FIG. 6 is a schematic cross-sectional view showing the second realization of the ESD protection circuit of FIG. 4 in the substrate of a deep-submicron integrated circuit. This realization differs from that of FIG. 5 only in that the ESD protection circuit is here formed with a large-size third N-well 60 in place of the second N-well 56 in the ESD protection circuit of FIG. 5. The semiconductor structure of the parasitic LBJT B1 in FIG. 6 is unsymmetric (by contrast, the parasitic LBJT B1 in FIG. 5 has a symmetric structure), which makes the drain and source of the FOD F1 to be wired to the input pad IP and the ground in a different manner from the wiring shown in FIG. 5. In FIG. 6, the drain 62 (which is a highly-doped diffusion area) of the FOD F1 is entirely enclosed in the third N-well 60, such that the collector of the parasitic LBJT B1 can be improved in its characteristics to increase the ESD robustness of the FOD F1.

Second Preferred Embodiment

Figure 7:
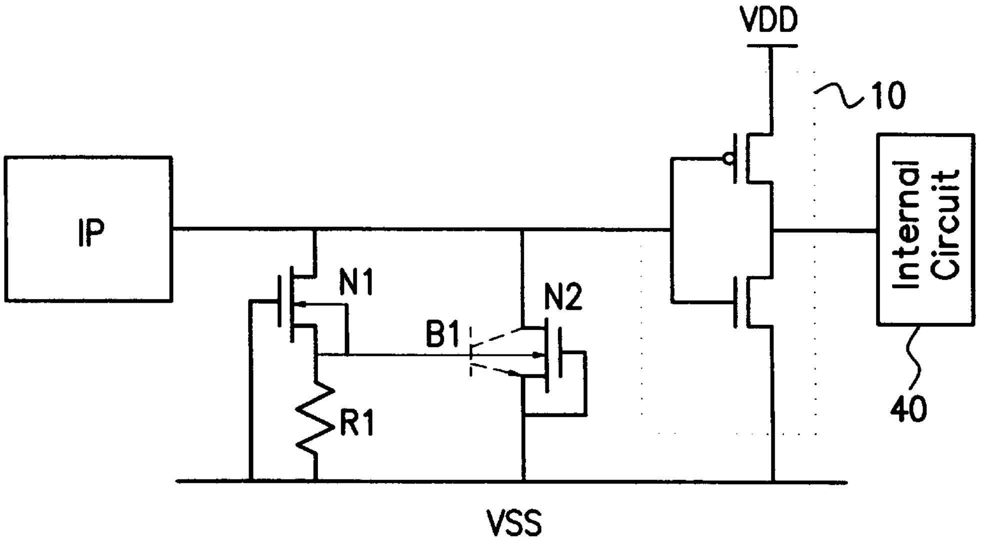
FIG. 7 is a schematic circuit diagram of a second preferred embodiment of the ESD protection circuit according to the invention.

FIG. 7 is a schematic circuit diagram of a second preferred embodiment of the ESD protection circuit according to the invention, which utilizes the substrate-triggering feature to provide a reliable ESD protection capability for the NMOS transistor formed with a thin oxide layer in the ESD protection circuit.

As shown, the ESD protection circuit of this embodiment is incorporated between an input pad IP and the input stage 10 of the internal circuit 40 of an integrated circuit. This ESD protection circuit includes a first NMOS transistor N1, a resistor R1, and a second NMOS transistor N2. The first NMOS transistor N1 here is substantially identical in structure and external connections to that in FIG. 4.

The first NMOS transistor N1 has a drain connected to the input pad IP, a gate connected to the ground $V_{SS}$, and a source connected via the resistor R1 to the ground $V_{SS}$; while the second NMOS transistor N2 has a drain connected to the input pad IP, a gate connected to the ground $V_{SS}$, and a source tied to its gate to be connected together to the ground $V_{SS}$. Both the source and the substrate of the first NMOS transistor N1 are tied together to be connected together to the substrate of the second NMOS transistor N2. Further, the second NMOS transistor N2 includes a parasitic LBJT B1, as drawn in dashed lines beside the second NMOS transistor N2 in FIG. 7. The parasitic LBJT B1 has a collector formed from the drain of the second NMOS transistor N2, an emitter formed from the source of the second NMOS transistor N2, and a base formed from the substrate of the second NMOS transistor N2 and is connected to the node between the resistor R1 and the source of the first NMOS transistor N1.

In FIG. 7, the second NMOS transistor N2 is formed with a long-channel so as to allow it to provide a high ESD current. In the event of an ESD stress, the parasitic LBJT B1 in the second NMOS transistor N2 can be triggered on by the substrate-triggering current from the first NMOS transistor N1 and resistor R1.

Figure 8:
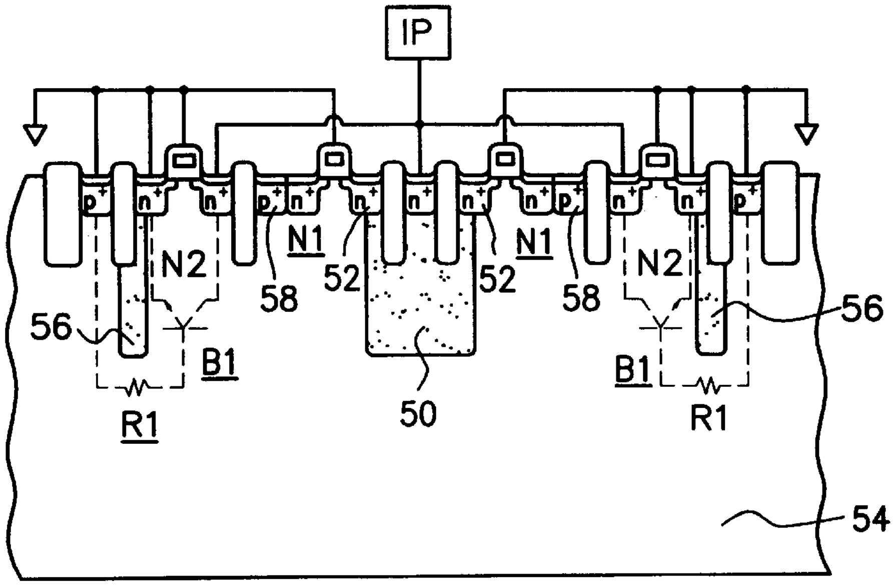
FIG. 8 is a schematic cross-sectional view of a first realization of the ESD protection circuit of FIG. 7 in the substrate of a deep-submicron integrated circuit.
Figure 9:
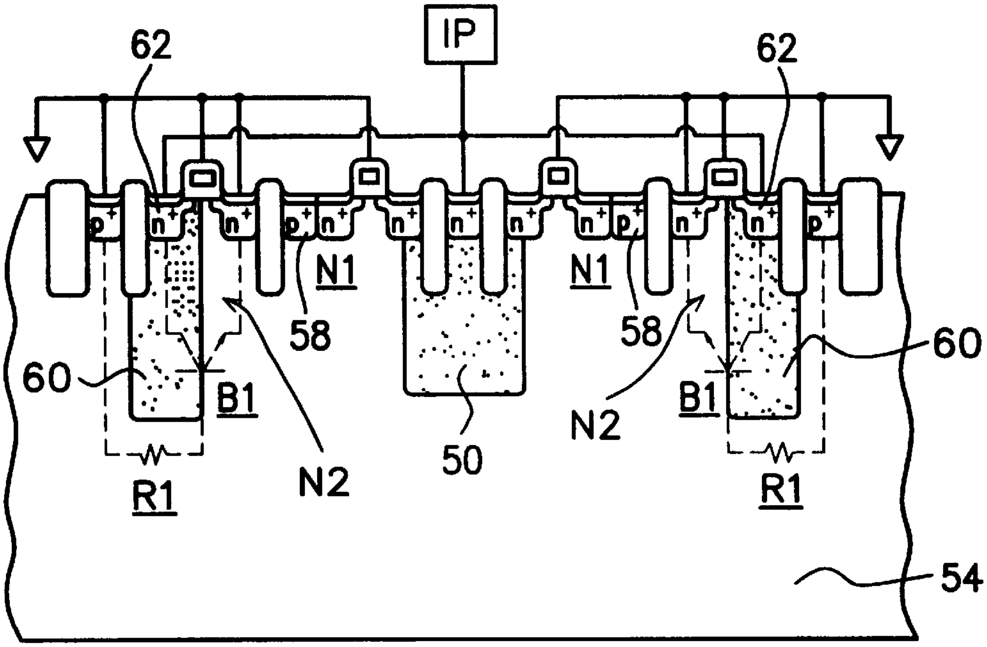
FIG. 9 is a schematic cross-sectional view of a second realization of the ESD protection circuit of FIG. 7 in the substrate of a deep-submicron integrated circuit.

FIGS. 8–9 are schematic cross-sectional diagrams showing two different realizations of the ESD protection circuit of FIG. 7 in a deep-submicron integrated circuit fabricated by the CMOS technology.

Referring to FIG. 8, in the first realization, the ESD protection circuit is fabricated on a substrate 54, such as a P-type substrate, which is formed with a first N-well 50 and a second N-well 56. The first N-well 50 can suppress the ESD current flowing through the short-channel NMOS transistor N1. The second N-wells 56 can enhance the performance of the parasitic LBJT B1 in the second NMOS transistor N2 and the reliability of the second NMOS transistor N2 in ESD protection. Other structures and functions are substantially the same as those shown in FIG. 5, so detailed description thereof will not be repeated.

Referring to FIG. 9, in the second realization, the ESD protection circuit of FIG. 9 differs from that of FIG. 8 only in that the second N-wells 56 in FIG. 8 is here replaced by a large-size third N-wells 60. The third N-well 60 is dimensioned with a wider area extending to the channel region of the second NMOS transistor N2, which entirely encloses the drain 62 of the second NMOS transistor N2 therein. This provision allows the breakdown voltage of the second NMOS transistor N2 to be further lowered. Therefore, the ESD voltage on the input pad IP can be restricted at a lower level, thus more effectively protecting the thin gate oxide in the input stage of the integrated circuit.

Third Preferred Embodiment

Figure 10:
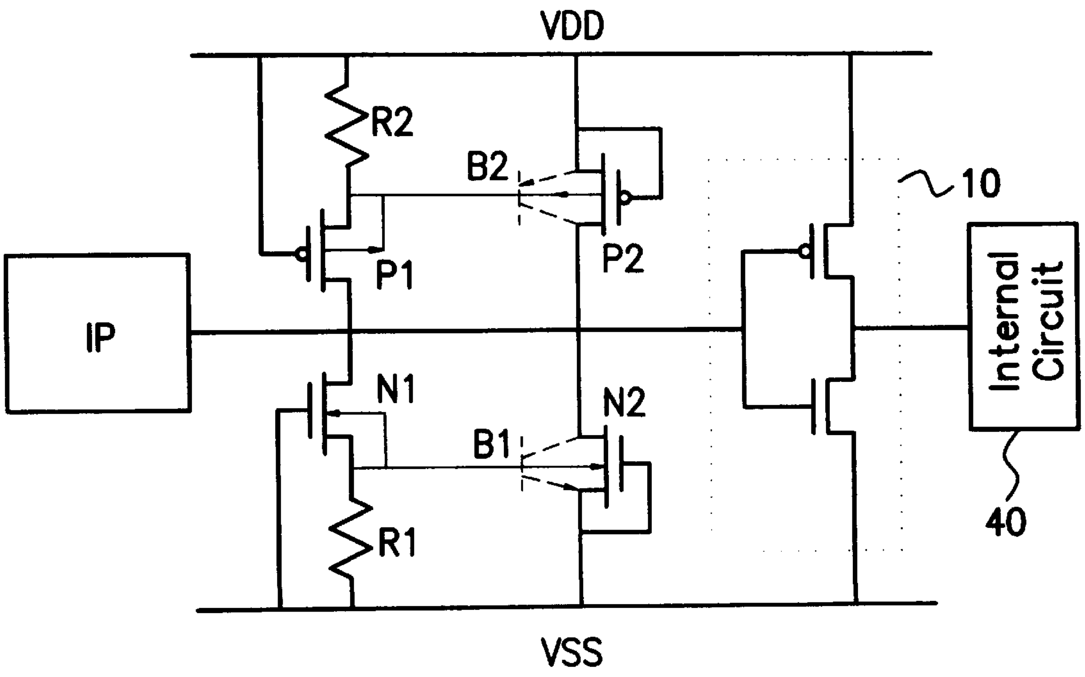
FIG. 10 is a schematic circuit diagram of a third preferred embodiment of the ESD protection circuit according to the invention.

FIG. 10 is a schematic circuit diagram of a third preferred embodiment of the ESD protection circuit according to the invention, which is also based on the above-mentioned substrate-triggering feature. As shown, the ESD protection circuit of this embodiment is incorporated between an input pad IP and the input stage 10 of the internal circuit 40 of the integrated circuit intended to be ESD protected by the ESD protection circuit.

The bottom part of the ESD protection circuit is identical to the circuit of FIG. 7, including a first NMOS transistor N1, a resistor R1, and a second NMOS transistor N2, which are arrangement in a similar manner as the circuit of FIG. 7. The ESD protection circuit of the third embodiment further includes a first PMOS transistor P1, a second resistor R2, and a second PMOS transistor P2, which are arranged in a mirror arrangement with respect to the first NMOS transistor N1, the resistor R1, and the second NMOS transistor N2. In a substantially similar manner, the first PMOS transistor P1 has a drain connected to the input pad IP, a gate connected to the system voltage $V_{DD}$, and a source connected via the resistor R2 to the system voltage $V_{DD}$; while the second PMOS transistor P2 has a drain connected to the input pad IP, a gate connected to the system voltage $V_{DD}$, and a source tied to its gate to be connected together to the system voltage $V_{DD}$. Both the source and the substrate of the first PMOS transistor P1 are tied together and connected to the substrate of the second PMOS transistor P2. A parasitic LBJT B2 exists in the second PMOS transistor P2, as indicated by the dashed-line symbol beside the second PMOS transistor P2. The parasitic LBJT B2 has a collector formed from the drain of the second PMOS transistor P2, an emitter formed from the source of the second PMOS transistor P2, and a base formed from the substrate of the second PMOS transistor P2 and connected to the node between the resistor R2 and the source of the first PMOS transistor P1. The first NMOS transistor N1 and the resistor R1 in conjunction can be used to trigger the second NMOS transistor N2 into conducting state through the substrate of the second NMOS transistor N2; and in a similar manner, the first PMOS transistor P1 and the resistor R2 in conjunction can be used to trigger the second PMOS transistor P2 into conducting state through the substrate of the second PMOS transistor P2.

Both the second NMOS transistor N2 and the second PMOS transistor P2 are formed with a long channel so as to allow them to provide a large ESD current; whereas both the first NMOS transistor N1 and the first PMOS transistor P1 are formed with a short channel so as to allow them to have a low snapback voltage. The complementary design of the ESD protection circuit of FIG. 10 allows an increased level of ESD protection capability for the input stage 10 and the internal circuit 40 of the deep-submicron integrated circuit.

The realization of the ESD protection circuit of FIG. 10 is similar to those shown in FIGS. 8–9 in the second preferred embodiment, so drawings and detailed description thereof will not be given and repeated.

Characteristics of the ESD protection circuit of the Invention

Figure 11:
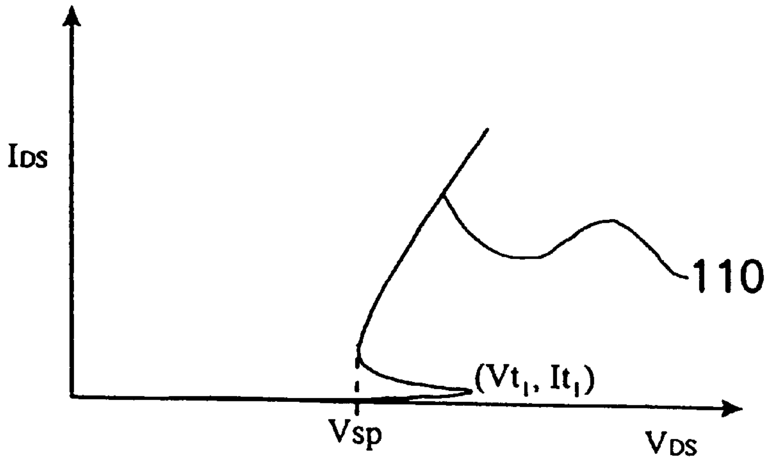
FIG. 11 is a graph, showing the $I_{DS}$ (drain-to-source current) versus $V_{DS}$ (drain-to-source voltage) characteristic of the gate-grounded NMOS transistor N1 used in the ESD protection circuit of the invention.

FIG. 11 is a graph showing the $I_{DS}$ (drain-to-source current) versus $V_{DS}$ (drain-to-source voltage) characteristic of the gate-grounded NMOS transistor N1 used in all the foregoing three preferred embodiments of ESD protection circuits according to the invention. The $I_{DS}$-$V_{DS}$ plot is indicated by the reference numeral 110. The snapback voltage is denoted by $V_{SP}$ in the graph. By the invention, the NMOS transistor N1 is specifically devised to operate in the snapback region (i.e., the region where $V_{DS}>V_{SP}$) so that it can suppress the ESD voltage on the gate oxide in the input stage 10. The smaller the snapback voltage $V_{SP}$, the higher is the resultant ESD protection capability. The NMOS transistor N1 can be triggered on when snapback breakdown occurs. The first breakdown point is denoted by ($V_{t1}$, $I_{t1}$). The smaller the first breakdown-point voltage $V_{t1}$, the higher is the ESD protection capability for the input stage 10. Fundamentally, the ESD protection capability can be enhanced by the following provisions: forming the NMOS transistor N1 with a short channel, a low snapback voltage $V_{SP}$, and a small first breakdown-point voltage $V_{t1}$.

Figure 12:
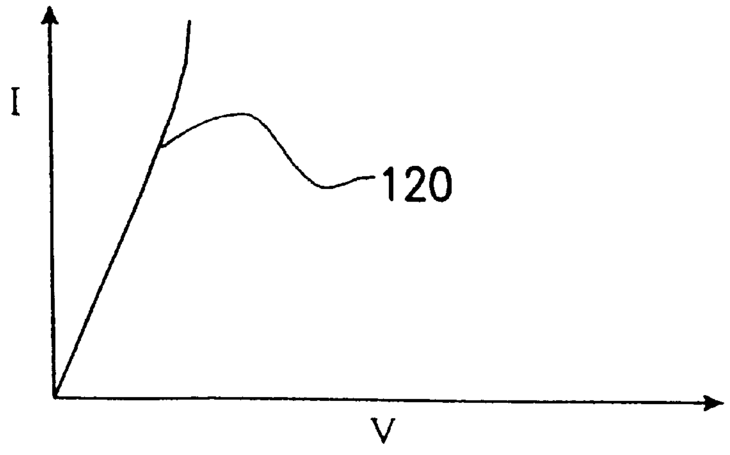
FIG. 12 is a graph, showing the I-V (current versus voltage) characteristic of a resistor R1 used in the ESD protection circuit of the invention.

FIG. 12 a graph showing the I-V (current versus voltage) characteristic plot of the resistor R1 used in the ESD protection circuit of the invention which is realized in the P-type substrate 54 from a PN junction. The I-V plot is indicated by the reference numeral 120.

Figure 13:
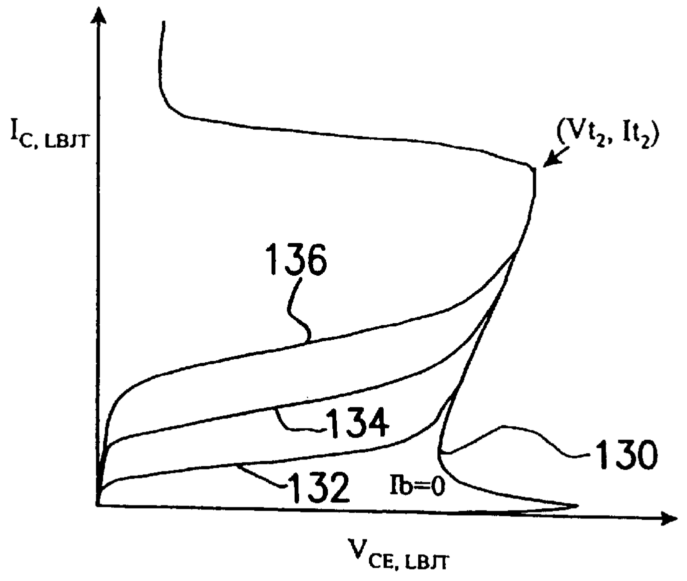
FIG. 13 is a graph, showing the $I_C$ (collector current) versus $V_{CE}$ (collector-to-emitter voltage) characteristic of the parasitic LBJT in the ESD protection circuit of the invention.

FIG. 13 is a graph showing the Ic (collector current) versus $V_{CE}$ (collector-to-emitter voltage) characteristic of the parasitic LBJT B1 in the FOD F1 used in the ESD protection circuit of FIG. 4 and that in the second NMOS transistor N2 used in the ESD protection circuit of FIG. 7 and FIG. 10 for various magnitudes of the base current $I_b$ in the parasitic LBJT B1. The plot 130 represents the $I_C$-$V_{CE}$ characteristic of the parasitic LBJT B1 for $I_b$=0. When the parasitic LBJT B1 is switched into conducting state, $I_b$ will be greater than 0; the plots 132, 134, 136 represent respectively the $I_C$-$V_{CE}$ characteristics of the parasitic LBJT B1 for three different levels of $I_b$ in increasing order. All the $I_C$-$V_{CE}$ characteristic curves 130, 132, 134, 136 have a common second breakdown point at ($V_{t2}$, $V_{t2}$). If the collector current $I_C$ exceeds the second-breakdown current $I_{t2}$, the device in which the parasitic LBJT B1 resides can be permanently damaged. The value of $I_{t2}$ is therefore the limit for the ESD protection by the parasitic LBJT B1. If the device has larger channel width and longer channel length, the value of $I_{t2}$ will be increased.

Figure 14:
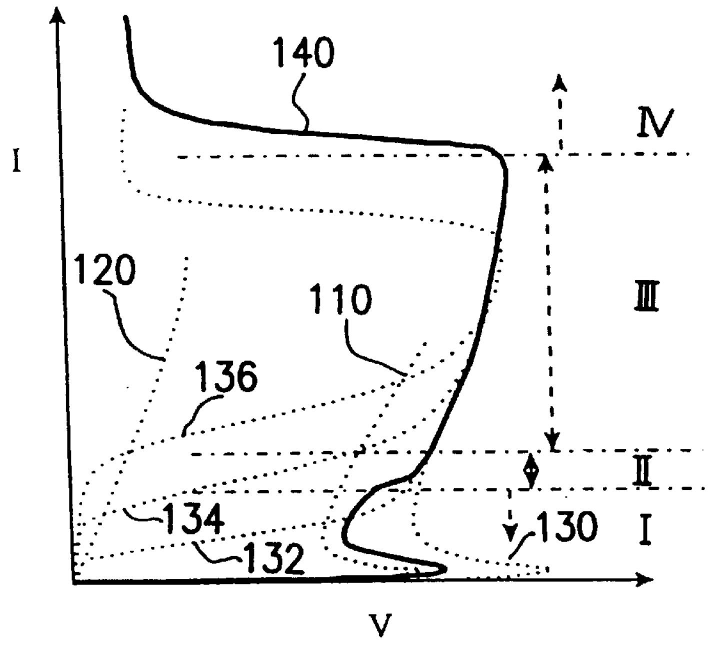
FIG. 14 is a graph, showing the totally various I-V (current versus voltage) characteristics of the ESD protection circuit of the invention.

FIG. 14 shows the total characteristics of the ESD protection circuit of the invention together in one graph for comparison purpose. In FIG. 14, the solid plot indicated by the reference numeral 140 shows the total current-voltage characteristic of the ESD protection circuit which utilizes a substrate-triggering feature for ESD protection, while the dashed curves indicated by the reference numerals 110, 120, 130, 132, 134, 136 are the current-voltage characteristics shown in FIGS. 11, 12, and 13.

In FIG. 14, the I-V space is divided into four regions, respectively denoted by I, II, III, and IV.

The region I is the snapback region of the NMOS transistor N1. It can be seen that the first breakdown point in the curve 140 is slightly shifted to the right of the first breakdown point in the curve 110 due to the fact that the curve 140 here is the combination of the curve 110 and the curve 120.

The region II is the combination of the breakdown characteristic curves of the NMOS transistor N1 and the resistor R1. It can be seen that the segment of the curve 140 in this region is slightly shifted upwards due to the fact that the parasitic LBJT B1 in this region has been switched into conducting state so that it contributes to part of the base current. The I-V characteristic of the parasitic LBJT B1 in this region is the combination of the curve 110, the curve 120, and the curve 132.

The region III shows the I-V characteristics of the ESD protection circuit when the parasitic LBJT B1 in the FOD F1 in FIG. 4, or that in the second NMOS transistor N2 in FIGS. 7 and 10, is triggered on (in conducting state). It can be seen that the segment of the curve 140 in this region is shifted upwards due to the substrate-triggering operation.

The region IV is the over-stress region of the parasitic LBJT B1. In this region, since the current in the parasitic LBJT B1 is greater than the second-breakdown current $I_{t2}$, it can cause permanent damage to the parasitic LBJT B1. In design, the size of the parasitic LBJT B1 can be suitable devised so as to allow the second-breakdown current $I_{t2}$ to be linearly increased in proportion, thereby achieving an increased level of reliability for the ESD protection circuit. The sizes of the other components in the ESD protection circuit can be specified depending on actual requirements.

In conclusion, the invention provides an ESD protection circuit which is characterized in that in the design of a substrate-triggering method to trigger a parasitic LBJT in the ESD protection circuit to thereby increase the second-breakdown current for enhanced ESD protection.

Further, the ESD protection circuit of the invention is characterized in that it can use a low triggering voltage for ESD protection while nonetheless providing an enhanced ESD protection for the deep-submicron integrated circuit.

Moreover, the ESD protection circuit of the invention is characterized in the provision of an N-well structure in the substrate, on which the ESD protection circuit and the associated deep-submicron integrated circuit are formed to enhance ESD protection.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An electrostatic discharge (ESD) protection circuit incorporated between an input pad and an internal circuit of an integrated circuit formed on a substrate, said ESD protection circuit comprising:

an input stage connected between the input pad and the internal circuit of the integrated circuit;

an NMOS transistor having a drain connected to the input pad, a gate connected to the ground, and a source connected to a common node;

a resistor connected between the common node and the ground; and an field oxide device (FOD) having a parasitic lateral bipolar junction transistor (LBJT) formed therein, and said FOD having a drain connected to the input pad and a source connected to the ground;

wherein the substrate of said FOD and the source and substrate of said NMOS transistor are connected together to the common node;

wherein said parasitic LBJT has a collector formed from the drain of said FOD and an emitter formed from the source of said FOD, and a base formed from the substrate of said FOD; and wherein a breakdown voltage of sad NMOS transistor is lower than a breakdown voltage of said FOD.

2. The ESD protection circuit of claim 1, wherein said input stage is a CMOS circuit.

3. The ESD protection circuit of claim 1, wherein said NMOS transistor is formed with a short channel.

4. The ESD protection circuit of claim 1, wherein said substrate is a P-type substrate.

5. An electrostatic discharge (ESD) protection circuit incorporated between an input pad and an internal circuit of an integrated circuit formed on a substrate, said ESD protection circuit compromising:

an input stage connected between the input pad and the internal circuit of the integrated circuit;

a first NMOS transistor having a drain connected to the input pad, a gate connected to the ground, and a source connected to a common node, and the substrate of said first NMOS transistor being connected to the common node;

a resistor connected between the common node and the ground; and a second NMOS transistor having a parasitic lateral bipolar junction transistor (LBJT) formed therein, and said second NMOS transistor having a drain connected to the input pad, a source connected to the ground, and a gate connected to the ground;

wherein the substrate of said second NMOS transistor and the source and substrate of said first NMOS transistor are connected together to the common node;

wherein said parasitic LBJT has a collector formed from the drain of said second NMOS transistor and an emitter formed from the source of said second NMOS transistor, and a base formed from the substrate of said second NMOS transistor; and wherein a breakdown voltage of said first NMOS transistor is lower than a breakdown voltage of said second NMOS transistor.

6. The ESD protection circuit of claim 5, wherein said first NMOS transistor is formed with a short channel.

7. The ESD protection circuit of claim 5, wherein said second NMOS transistor is formed with a long channel.

8. The ESD protection circuit of claim 5, wherein said substrate is a P-type substrate.

9. An electrostatic discharge (ESD) protection circuit incorporated between an input pad and an internal circuit of an integrated circuit formed on a substrate, said ESD protection circuit compromising;

an input stage connected between the input and the internal circuit of the integrated circuit;

a first NMOS transistor having a channel of a first semiconductor type, said first NMOS transistor further having a drain connected to the input pad, a gate connected to a bias point, and a source connected to a common node, and the substrate of said first NMOS transistor being connected to the common node;

a resistor connected between the common node and the bias point; and a second NMOS transistor having a channel of the first semiconductor type, said second NMOS transistor further having a parasitic lateral bipolar junction transistor (LBJT) formed therein, and said second NMOS transistor having a drain connected to the input pad, a source connected to the bias point, and a gate connected to the bias point;

wherein the substrate of said second NMOS transistor and the source and substrate of said first NMOS transistor are connected together to the common node;

wherein said parasitic LBJT has a collector formed from the drain of said second NMOS transistor and an emitter formed the source of said second NMOS transistor, and a base formed from the substrate of said second NMOS transistor; and wherein a breakdown voltage of said first NMOS transistor is lower than a breakdown voltage of said second NMOS transistor.

10. The ESD protection circuit of claim 9, wherein said channel of the first semiconductor type is an N-type channel.

11. The ESD protection circuit of claim 10, wherein said substrate is a P-type substrate.

12. The ESD protection circuit of claim 9, wherein said channel of the first semiconductor type is a P-type channel.

13. The ESD protection circuit of claim 12, wherein said substrate is an N-type substrate.

14. The ESD protection circuit of claim 9, wherein said first NMOS transistor is formed with a short channel.

15. The ESD protection circuit of claim 9, wherein said second NMOS transistor is formed with a long channel.

* * * * *